US011600692B2

(12) United States Patent
Kanie et al.

(10) Patent No.: US 11,600,692 B2
(45) Date of Patent: Mar. 7, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Sozo Kanie, Himeji Hyogo (JP); Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 74 days.

(21) Appl. No.: 17/189,202

(22) Filed: Mar. 1, 2021

(65) Prior Publication Data

US 2022/0093729 A1   Mar. 24, 2022

(30) Foreign Application Priority Data

Sep. 18, 2020   (JP) .............................. JP2020-157510

(51) Int. Cl.
*H01L 29/06* (2006.01)
*H01L 29/40* (2006.01)

(52) U.S. Cl.
CPC ........ *H01L 29/0623* (2013.01); *H01L 29/404* (2013.01)

(58) Field of Classification Search
CPC ............... H01L 29/404; H01L 29/0692; H01L 29/2003; H01L 29/7395; H01L 29/0696; H01L 29/8611; H01L 29/1608; H01L 29/0649; H01L 29/78606; H01L 29/78642; H01L 29/0619–0623;
(Continued)

(56) References Cited

U.S. PATENT DOCUMENTS 6,670,710 B2   12/2003   Matsunaga
8,847,278 B2   9/2014   Takei et al.
(Continued)

FOREIGN PATENT DOCUMENTS

JP   H0794704 A   4/1995
JP   2002353307 A   12/2002
(Continued)

OTHER PUBLICATIONS

US 7,737,496 B2, 06/2010, Thean et al. (withdrawn)
(Continued)

*Primary Examiner* — Shahed Ahmed
(74) *Attorney, Agent, or Firm* — Kim & Stewart LLP

(57) ABSTRACT

According to one embodiment, a semiconductor device has a cell region and an end region adjacent to the cell region in a first direction and surrounding the cell region. A first semiconductor layer of a first conductivity type is in the cell region and the end region. Guard rings of a second conductivity type are at a first surface in the end region. The guard rings surround the cell region. An insulating film is on the first surface in the end region. Conductive members are on the insulating film and separated from the guard rings in a second direction. A first conductive member has a cell-region-side edge above a central portion of a first guard ring. The first guard ring has an end-region-side edge below a central portion of the first conductive member.

20 Claims, 8 Drawing Sheets

(58) Field of Classification Search
CPC .................. H01L 29/66674–66734; H01L 29/7801–7826; H01L 29/04–045; H01L 29/0856–0869; H01L 29/0873–0886
See application file for complete search history.

(56) References Cited

U.S. PATENT DOCUMENTS

| | | |
|---|---|---|
| 9,059,238 B2 | 6/2015 | Kurata et al. |
| 9,905,644 B2 | 2/2018 | Abiko et al. |
| 2004/0238884 A1* | 12/2004 | Tanaka ................ H01L 29/7397 257/341 |
| 2016/0308037 A1* | 10/2016 | Sakata ................ H01L 29/0615 |
| 2018/0233554 A1* | 8/2018 | Mitsuzuka .......... H01L 27/0635 |
| 2021/0175369 A1* | 6/2021 | Ohse .................... H01L 29/872 |
| 2022/0045205 A1* | 2/2022 | Blanchard ........... H01L 29/7455 |

FOREIGN PATENT DOCUMENTS

| | | |
|---|---|---|
| JP | 5716591 B2 | 5/2015 |
| JP | 2015179774 A | 10/2015 |
| JP | 201898254 A | 6/2018 |
| WO | 2012099079 A1 | 7/2012 |
| WO | 2013035818 A1 | 3/2013 |
| WO | 2015104900 A1 | 7/2015 |

OTHER PUBLICATIONS

Onose, H. et al. "Termination Technology of SiC Devices for High Reliability," IEEJ-EDD16039, The Institute of Electrical Engineers of Japan, Mar. 28-29, 2016, Tokyo, Machine Translation, 14 pages.

\* cited by examiner

SEMICONDUCTOR DEVICE

CROSS-REFERENCE TO RELATED APPLICATION(S)

This application is based upon and claims the benefit of priority from Japanese Patent Application No. 2020-157510, filed Sep. 18, 2020, the entire contents of which are incorporated herein by reference.

FIELD

Embodiments described herein relate generally to a semiconductor device.

BACKGROUND

A semiconductor material comprising silicon carbide (SiC) has dielectric breakdown strength about ten times that of silicon (Si), but silicon carbide contributes to the generation of high current in a power semiconductor device. With the generation of high current, an increase in breakdown voltage is also required at a terminal region of the semiconductor device.

DETAILED DESCRIPTION

Figure 1:
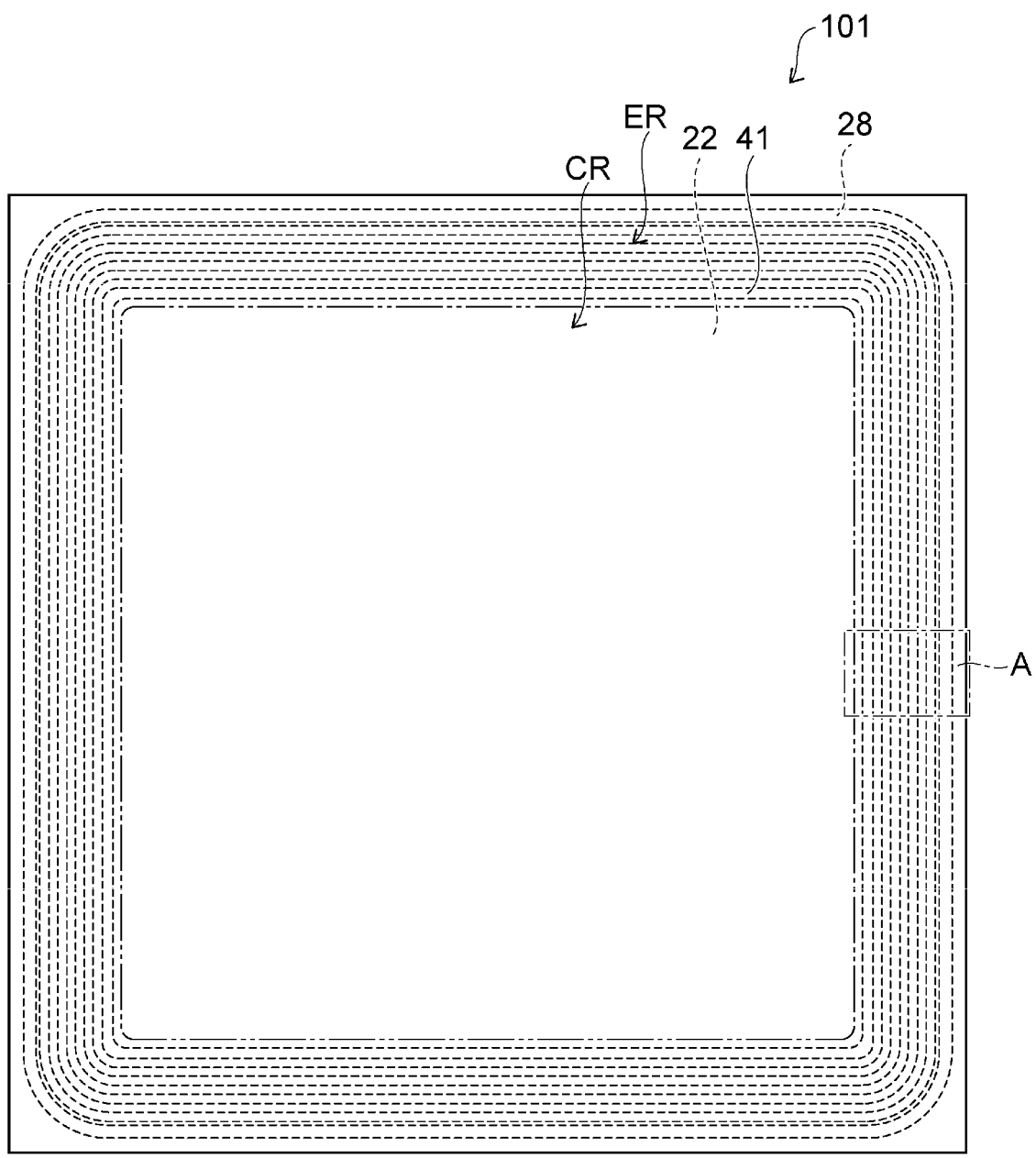
FIG. 1 is a plan view illustrating a semiconductor device according to a first embodiment.

Embodiments can provide semiconductor devices with improved reliability.

In general, according to one embodiment, a semiconductor device includes a cell region and an end region adjacent to cell region in a first direction and surrounding the cell region. A first semiconductor layer of a first conductivity type is in the cell region and the end region. A plurality of guard rings of a second conductivity type is at a first surface of the first semiconductor layer in the end region. The guard rings surround the cell region and are concentrically spaced from each other in the first direction. An insulating film is on the first surface of the first semiconductor layer in the end region. A plurality of conductive members is on the insulating film and separated from the plurality of guard rings by the insulating film in a second direction orthogonal to the first surface. A first conductive member in the plurality of conductive members has a cell-region-side edge above, in the second direction, a central portion of a first guard ring in the plurality of guard rings. The first guard ring has an end-region-side edge below, in the second direction, a central portion of the first conductive member.

Hereinafter, certain example embodiments will be described with reference to the drawings.

The drawings are schematic, and relationships between the thickness and the width of portions, ratios of sizes among the portions, and the like are not necessarily the same as the actual values thereof. Even for identical portions, different dimensions and ratios may be shown in the drawings. In the specification and the drawings, elements substantially similar to those already described for a drawing are denoted with the same numbers and characters, and the repeated description thereof may be omitted as appropriate.

First Embodiment

Figure 2:
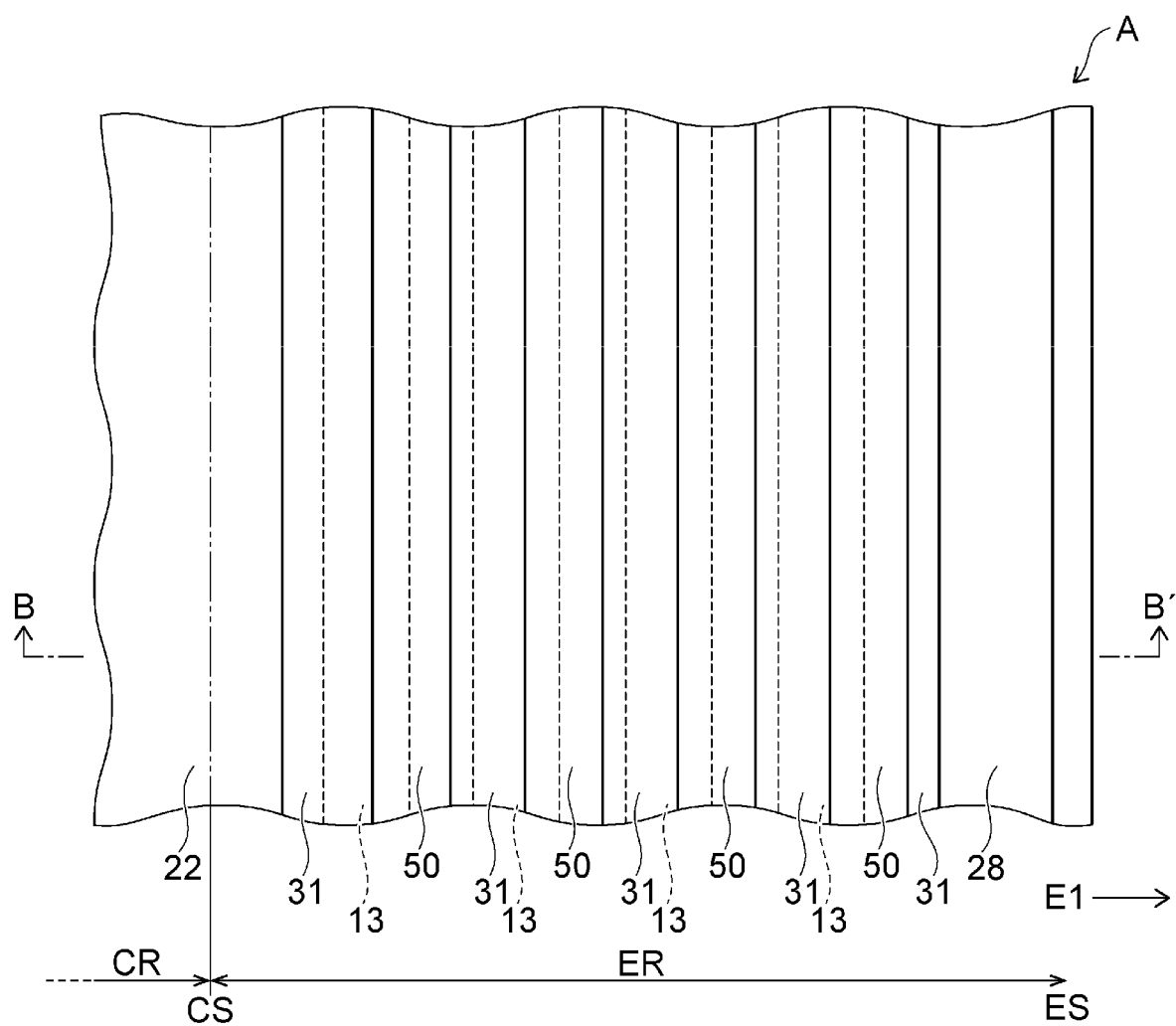
FIG. 2 is an enlarged plan view of a region A of FIG. 1.
Figure 3:
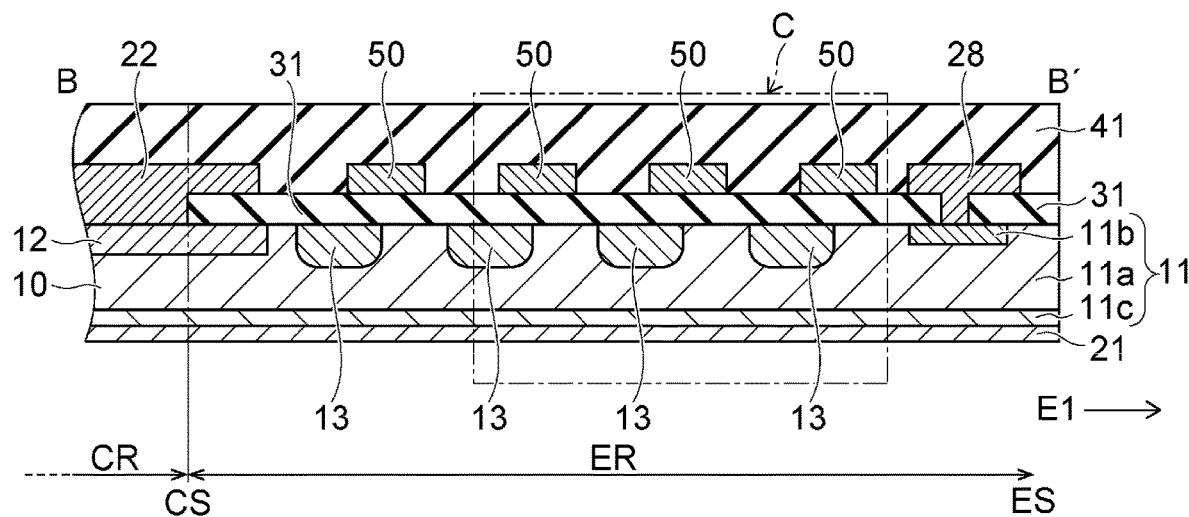
FIG. 3 is a cross-sectional view taken along a line B-B' illustrated in FIG. 2.
Figure 4:
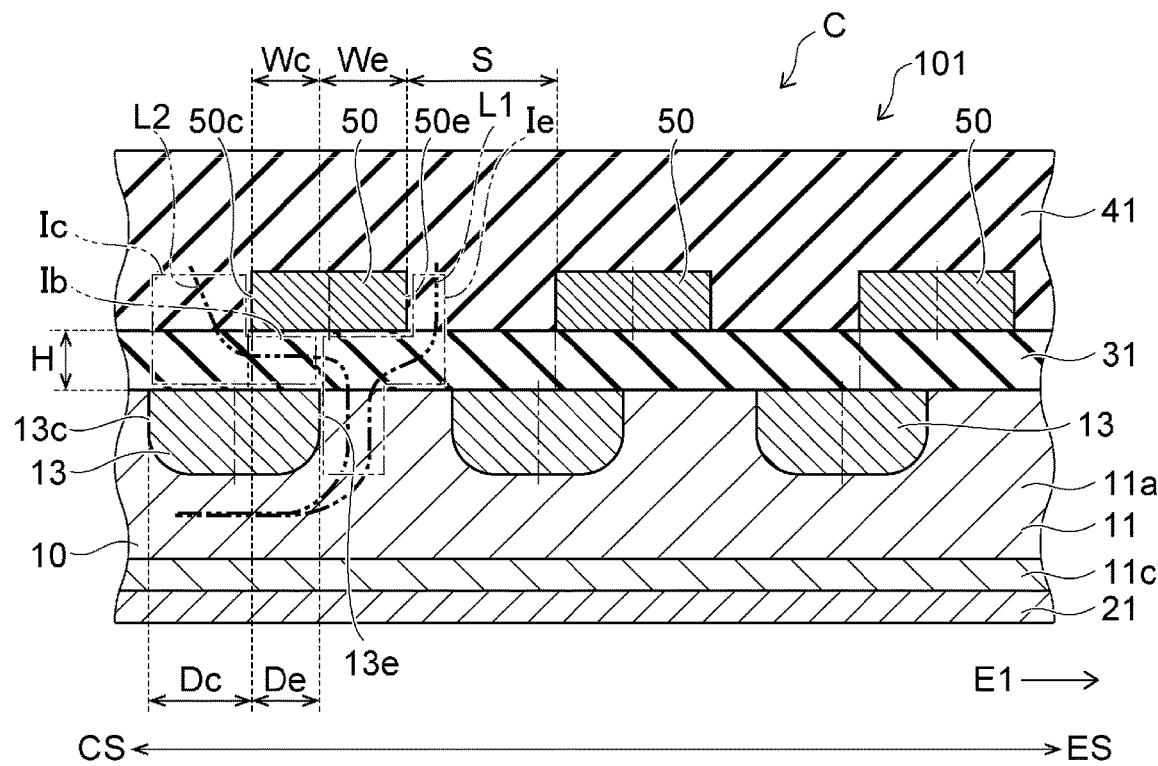
FIG. 4 is an enlarged cross-sectional view of a region C of FIG. 3.

FIG. 1 is a plan view illustrating a semiconductor device according to an embodiment. FIG. 2 is an enlarged plan view of a region A of FIG. 1. FIG. 3 is a cross-sectional view taken along a line B-B' illustrated in FIG. 2. FIG. 4 is an enlarged cross-sectional view of a region C of FIG. 3. In FIGS. 1 to 3, a wiring layer is omitted from the depiction. In FIG. 2, a protective film 41 (described below) is omitted from the depiction.

For example, a semiconductor device 101 according to this embodiment is used for control of a current to be supplied to a vehicle such as a railway vehicle, and a voltage of several thousands of volts is applied to the semiconductor device. For example, the semiconductor device 101 is a metal-oxide-semiconductor-field-effect-transistor (MOSFET).

As illustrated in FIGS. 1 to 3, a cell region CR, where a current level is controlled, and an end region ER that surrounds the cell region CR are provided in the semiconductor device 101. In some instances, the end region ER may be referred to as a terminal region. In FIGS. 1 to 3, the cell region CR is the region inside the two-dot chain line, and the end region ER is the region outside the two-dot chain line. In the end region ER, a side nearer the cell region CR is called a cell side CS, and away from the cell region CR towards a dicing line is called an end side ES.

As illustrated in FIGS. 1 to 3, the semiconductor device 101 has a stacked structure, and the stacked structure has a substantially rectangular parallelepiped shape. The semiconductor device 101 includes a semiconductor portion 10, a first electrode 21, a second electrode 22, a conductive member 50, an end electrode 28, an insulating film 31, and the protective film 41.

The first electrode 21 is provided over a whole region of a bottom surface of the semiconductor device 101 and has a substantially flat plate shape. For example, the first electrode 21 is a drain electrode.

The semiconductor portion 10 is provided on the first electrode 21 and has a substantially rectangular parallelepiped shape. As illustrated in FIG. 3, the semiconductor portion 10 includes a first semiconductor layer 11, a second semiconductor layer 12, and a guard ring layer 13. For example, the semiconductor portion 10 comprises silicon carbide or gallium nitride (GaN).

The first semiconductor layer 11 is a first conductivity type, and for example, includes an n-type semiconductor. As illustrated in FIG. 3, the first semiconductor layer 11 includes a lower layer semiconductor layer 11c, a base semiconductor layer 11a, and an end semiconductor layer 11b. In both the cell region CR and the end region ER, the lower layer semiconductor layer 11c is provided on the first electrode 21 and is in contact with the first electrode 21. For example, the lower layer semiconductor layer 11c is a semiconductor layer on a drain side. For example, the lower layer semiconductor layer 11c includes an n$^+$-type semiconductor. Here, "n$^+$-type" denotes that the carrier concentration is higher than "n$^-$-type."

The base semiconductor layer 11a is provided on the lower layer semiconductor layer 11c in both the cell region CR and the end region ER. For example, the base semiconductor layer 11a includes an n$^-$-type semiconductor. The end semiconductor layer 11b is provided on the base semiconductor layer 11a in the end region ER. The end semiconductor layer 11b is formed in a frame shape surrounding the cell region CR. The end semiconductor layer 11b is provided on the end side ES of the semiconductor device 101. For example, the end semiconductor layer 11b is disposed along an outer edge of the semiconductor device 101. For example, the end semiconductor layer 11b includes an n$^+$-type semiconductor.

As illustrated in FIG. 3, the second semiconductor layer 12 is provided on the base semiconductor layer 11a in the cell region CR. Apart of the second semiconductor layer 12 on the end side ES is disposed in the end region ER. The second semiconductor layer 12 is a second conductivity type, for example, p type. For example, the second semiconductor layer 12 is a semiconductor layer on a source side.

As illustrated in FIGS. 2 and 3, the guard ring layer 13 is, for example, a guard ring and improves the breakdown voltage in the end region ER. A plurality of the guard ring layers 13, for example, four guard ring layers 13 are provided on the base semiconductor layer 11a in the end region ER. An upper surface of the guard ring layers 13 is in contact with the insulating film 31, and a surface other than the upper surface is in contact with the base semiconductor layer 11a. The guard ring layers 13 are a second conductivity type, for example, p type.

As illustrated in FIGS. 1 to 3, the guard ring layers 13 have frame shapes that are substantially similar shapes of different sizes as viewed in a plan view, and are disposed concentrically so as to surround the cell region CR. The guard ring layers 13 are disposed so that in adjacent two of the guard ring layers 13, the guard ring layer 13 on the end side ES surrounds the guard ring layer 13 on the cell side CS.

As illustrated in FIG. 3, the insulating film 31 is provided on the semiconductor portion 10 and is in contact with an upper surface of the semiconductor portion 10. Specifically, at a portion other than portions of the semiconductor portion 10 that are in contact with the second electrode 22 and the end electrode 28, the upper surface of the semiconductor portion 10 is covered with the insulating film 31. The insulating film 31 contains silicon and oxygen (O), and for example, contains silicon oxide (SiO).

As illustrated in FIGS. 2 and 3, the second electrode 22 is provided on the semiconductor portion 10 over the whole cell region CR and also a portion of the end region ER on the cell side CS. For example, the second electrode 22 is a source electrode. As illustrated in FIG. 3, the second electrode 22 is provided on the second semiconductor layer 12. A lower surface of the second electrode 22 is in contact with the second semiconductor layer 12 in the cell region CR and is in contact with the insulating film 31 in the end region ER.

As illustrated in FIGS. 1 to 3, the end electrode 28 has a substantially frame shape surrounding the cell region CR in the end region ER. As illustrated in FIG. 3, the end electrode 28 is provided on the insulating film 31 and has a lower surface having a downward extension, and the downward extension is in contact with the end semiconductor layer 11b. The end electrode 28 is connected to the first electrode 21 through the lower layer semiconductor layer 11c, the base semiconductor layer 11a, and the end semiconductor layer 11b, and therefore the potential of the end electrode 28 is approximately equal to that of the first electrode 21.

For example, the conductive member 50 contains titanium (Ti) or polysilicon (Si). For example, four conductive members 50 are provided on the insulating film 31 in the end region ER, as illustrated in FIGS. 1 to 3. A lower surface of the conductive members 50 is in contact with the insulating film 31, and a surface other than the lower surface is in contact with the protective film 41. The conductive members 50 are separated from the guard ring layers 13 through the insulating film 31. For example, the conductive members 50 are in an electrically floating state.

As viewed from above, each of the conductive members 50 covers the corresponding guard ring layer 13 through the insulating film 31, as illustrated in FIG. 3. From the conductive members 50, a conductive region is formed intermittently above the guard ring layers 13 in the end region ER.

As illustrated in FIGS. 1 to 3, the conductive members 50 have a substantially frame shape surrounding the cell region CR in the end region ER. In apart of the end region ER as illustrated in FIG. 2, the conductive members 50 extend so as to surround the cell region CR and spaced from each other in a first direction E1. The first direction E1 is a direction orthogonal to an outer circumference of the cell region CR in a plan view. The shape of the conductive members 50 is not limited to the substantially frame shape surrounding the cell region CR. For example, the conductive members 50 may be a plurality of substantially strip-shaped conductive members that are each arranged along one of the guard ring layers 13 surrounding the cell region CR.

The protective film 41 is provided on the insulating film 31 and the conductive members 50. For example, the protective film 41 contains polyimide (PI). In this embodiment, the insulating film 31 is provided between the conductive members 50 and the semiconductor portion 10. However, the protective film 41 may be further provided between the conductive members 50 and the semiconductor portion 10.

Hereinafter, a positional relationship between the conductive members 50 and the guard ring layers 13 will be further described.

As illustrated in FIGS. 3 and 4, the conductive members 50 each include a cell-side portion Wc and an end-side portion We. The cell-side portion Wc is positioned directly above the corresponding guard ring layer 13. The cell-side portion Wc is separated from the corresponding guard ring layer 13 through the insulating film 31. As viewed from above, an end-side portion De of the corresponding guard ring layer 13 is covered with the cell-side portion Wc. The end-side portion We is a portion on the end side ES including an end-side edge 50e of each of the conductive members 50. The end-side portion We is not positioned directly above the corresponding guard ring layer 13. As viewed from above, the corresponding guard ring layer 13 is not covered with the end-side portion We.

The guard ring layers 13 each include a cell-side portion Dc including a cell-side edge 13c, and the end-side portion De including an end-side edge 13e. The cell-side portion Dc is not covered with the corresponding conductive member 50. The end-side portion De is positioned directly below the cell-side portion Wc of the corresponding conductive member 50. The length of the end-side portions De in the first direction E1 is the same as the length of the cell-side portions Wc of the conductive member 50 in the first direction E1. When the lengths of the guard ring layers 13 in the first direction E1 vary depending on the thickness directions of the guard ring layers 13, for example, the maximum length is used as the lengths of the guard ring layers 13 in the first direction E1. When the lengths of the conductive members 50 in the first direction E1 vary depending on the thickness directions of the conductive members 50, for example, the maximum length is used as the lengths of the conductive members 50 in the first direction E1. Each interval S is disposed between the conductive members 50. An interval H is disposed between the conductive members 50 and the guard ring layers 13 in the vertical direction. The length of the interval H corresponds to the thickness of the insulating film 31.

The conductive members 50 each have an edge 50c on the cell side CS and the edge 50e on the end side ES. The guard ring layers 13 each have the edge 13c on the cell side CS and the edge 13e on the end side ES. The end-side edge 50e of each of the conductive members 50 is nearer to the end side ES than the end-side edge 13e of each of the guard ring layers 13. The cell-side edge 50c of each of the conductive members 50 is nearer to the end side ES than a region directly above the cell-side edge 13c of each of the guard ring layers 13 and up to a region directly above the end-side edge 13e. As viewed from above, the portion Wc of each of the conductive members 50 on the cell side CS covers the portion De of the corresponding guard ring layer 13 on the end side ES. The cell-side portion Wc of each of the conductive members 50 is a portion including at least the cell-side edge 50c.

As illustrated in FIG. 4, the first guard ring layer 13 is not provided between the end-side portion We of the first conductive member 50 and the base semiconductor layer 11a. The first guard ring layer 13 is provided between the cell-side portion Wc of the first conductive member 50 and the base semiconductor layer 11a.

The semiconductor device 101 according to this embodiment may be a high breakdown voltage semiconductor device, but not MOSFET. For example, the semiconductor device 101 may be a high voltage semiconductor device such as an insulated gate bipolar transistor (IGBT) or a fast recovery diode (FRD).

In the embodiment, above the guard ring layers 13, the conductive members 50 in the same number as the number of the guard ring layers 13 form intermittent conductive regions. However, the configuration of the semiconductor device is not limited to this configuration. For example, above one to three guard ring layers 13 of four guard ring layers 13, one to three conductive members 50 may satisfy the aforementioned positional relationship.

Hereinafter, an operation of the semiconductor device 101 according to the embodiment will be described.

In the semiconductor device 101 according to the embodiment, the semiconductor portion 10 contains silicon carbide, and therefore high breakdown voltage can be achieved in the cell region CR. Accordingly, high breakdown voltage is required even for the end region ER. The semiconductor device 101 is disposed in a sealing resin. For example, the sealing resin is a thermosetting resin such as an epoxy resin, or a gel of a silicone resin or the like.

When the conductive members 50 are disposed in the end region ER as illustrated in FIGS. 3 and 4, an external influence of external charges contained in the sealing resin or the like is reduced.

The conductive members 50 are not connected to the guard ring layers 13. For example, the conductive members 50 are in an electrically floating state. Therefore, the potential of the conductive members 50 is generally different from that of the guard ring layers 13. Accordingly, in the base semiconductor layer 11a, the insulating film 31, and the protective film 41 around the conductive members 50 and the guard ring layers 13, a potential distribution in which the potential varies according to the control of current in the cell region CR is formed, and an isoelectric line is generated.

Hereinafter, a region between the cell-side portion Wc of each of the conductive members 50 and the end-side portion De of each of the guard ring layers 13 is referred to as a boundary region Ib for convenience of explanation. The length of the boundary region Ib in the vertical direction is the same as the length of the interval H. A region that is in contact with the boundary region Ib and is nearer to the end side ES than the boundary region Ib, a region that is in contact with each of the conductive members 50 and is nearer to the end side ES than each of the conductive members 50, and a region that is in contact with the corresponding guard ring layer 13 and is nearer to the end side ES than the guard ring layer 13 are referred to as first region Ie. A region that is in contact with the boundary region Ib and is nearer to the cell side CS than the boundary region Ib, a region that is in contact with each of the conductive members 50 and is nearer to the cell side CS than each of the conductive members 50, and a region directly above the cell-side portion Dc of the corresponding guard ring layer 13 are referred to as second region Ic.

When a reverse bias voltage is applied to the cell region CR in the semiconductor device 101, the electric field is enhanced at a lower portion of each of the guard ring layers 13 on the end side ES. As a result, holes that have high energy are emitted and entered into the insulating film 31. The holes entered into the insulating film 31 are trapped by a hole trap level (hole trap) in the insulating film 31. When the level of hole trap is deep, the holes are not easily emitted. Therefore, the holes are considered as fixed charges. By fixed positive charges, electrons of the semiconductor portion 10 are attracted to an upper surface, and the electric field strength in the first region Ie is increased. By positive charges accumulated in the insulating film 31, for example, an impurity of the guard ring layers 13 of p type is extruded, and the effective impurity concentration of the guard ring layers 13 is decreased. With the decrease in impurity concentration of the guard ring layers 13, an isoelectric line L1 in the first region Ie may be made close to the guard ring layers 13, to decrease the breakdown voltage of the semiconductor device 101 or to destroy the insulating film 31.

Hereinafter, an effect of the semiconductor device 101 according to the embodiment will be described.

According to the semiconductor device 101 according to the embodiment, for example, the conductive members 50 in an electrically floating state are provided above the guard ring layers 13 formed in the upper portion of the semiconductor portion 10, and the influence of external charges is reduced. For example, the conductive members 50 are in an electrically floating state and are separated from the guard ring layers 13 through the insulating film 31, the end-side edge 50e of each of the conductive members 50 is positioned nearer to the end side ES than the end-side edge 13e of each of the guard ring layers 13, and the cell-side edge 50c is positioned nearer to the end side ES than the cell-side edge 13c of each of the guard ring layers 13 and up to a region directly above the end-side edge 13e. Specifically, in the semiconductor device 101 of the embodiment, the end-side edge 50e of each of the conductive members 50 is projected toward the end side ES, and therefore a voltage is shared, and approach of the isoelectric line L1 to the guard ring layers 13 is prevented. Accordingly, in the semiconductor device 101, a decrease in breakdown voltage due to hot carrier injection to the insulating film 31 can be prevented.

Furthermore, when the electric field strength in the first region Ie is equal to or more than a certain value, the isoelectric line L1 in the first region Ie is switched to an isoelectric line L2 in the boundary region Ib and the second region Ic. Therefore, an increase in electric field in the first region Ie can be prevented, and dielectric breakdown of the semiconductor portion 10 and the insulating film 31 can be prevented. When the electric field strength in the first region Ie is relaxed, additional hot carrier injection to the insulating film 31 can be prevented. Therefore, in the semiconductor device 101 of the embodiment, the breakdown voltage in the end region ER can be increased, and dielectric breakdown of the insulating film 31 can be prevented.

Furthermore, the conductive members 50 are not disposed directly above the cell-side portions Dc of the guard ring layers 13. Therefore, the concentration of electric field on the cell side CS of the conductive members 50 is relaxed.

Accordingly, in the semiconductor device 101, dielectric breakdown of the insulating film 31 can be prevented, and a decrease in breakdown voltage in the end region ER can be prevented even when a high electric field is generated in the end region ER.

Test Examples

Hereinafter, the breakdown voltage in the semiconductor device 101 according to an embodiment and the maximum electric field in the insulating film will be described using certain test examples ("samples" in the following).

Figure 5A:
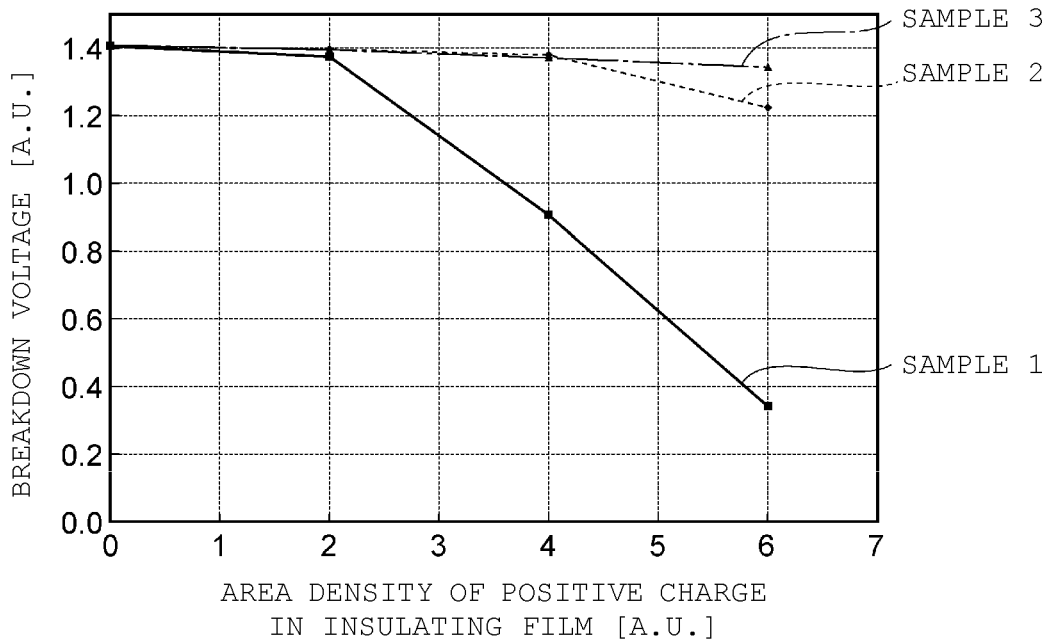
FIG. 5A is a graph showing a change of breakdown voltage with an increase of positive charge in an insulating film.

FIG. 5A is a graph showing a change of breakdown voltage with an increase of positive charge in an insulating film, the graph in which a horizontal axis represents the area density of the positive charge in the insulating film, and a vertical axis represents the breakdown voltage.

Figure 5B:
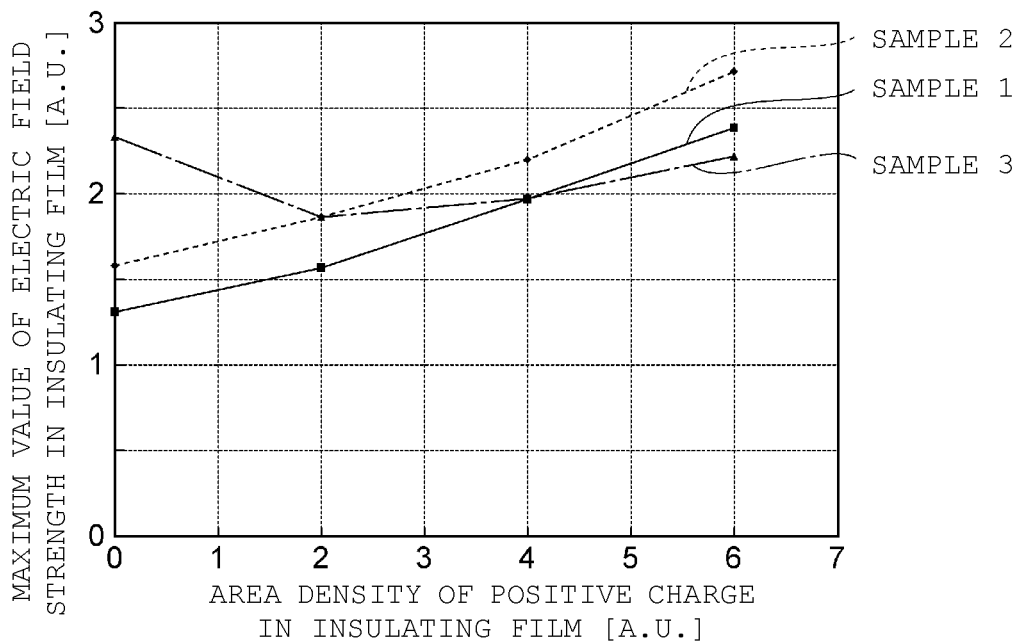
FIG. 5B is a graph showing a change of maximum electric field strength with an increase of the positive charge in the insulating film.

FIG. 5B is a graph showing a change of maximum electric field strength with an increase of the positive charge in the insulating film, the graph in which a horizontal axis represents the area density of the positive charge in the insulating film, and a vertical axis represents a maximum value of electric field strength in the insulating film.

A first sample ("sample 1") has a guard ring layer with the same width as that of the guard ring layer 13, but does not include a conductive member 50. A second sample ("sample 2") has a guard ring layer with the same width as that of the guard ring layer 13, and a conductive member (similar to conductive member 50) that is provided on the guard ring layer and electrically connected to an upper surface of the guard ring layer. A third sample ("sample 3") corresponds to the first embodiment. The conductive member 50 in a floating state is disposed nearer to the end side than each of the guard ring layers 13. For purposes of comparison, each guard ring layer and each conductive member (when included in the sample) has the width and the thickness in samples 1 to 3. In samples 2 and 3, the number of the conductive members provided is the same. In the samples 1 to 3 all other relevant configurations are identical.

As shown in FIG. 5A, when hot carriers are not injected in the insulating film, that is, the area density of positive charge in the insulating film is 0 [a.u.], the breakdown voltages of the samples 1 to 3 are the same. In the sample 1, hot carriers are injected to decrease the breakdown voltage at area densities of positive charge in the insulating film of 4 [a.u.] and 6 [a.u.].

In the sample 2, hot carriers are injected to decrease the breakdown voltage at an area density of positive charge of 6 [a.u.].

In the sample 3, a decrease in breakdown voltage is hardly observed even at an area density of positive charge of 6 [a.u.]. Therefore, in the sample 3 (corresponding to the first embodiment), a variation in breakdown voltage due to hot carrier injection is prevented, and the breakdown voltage is kept high.

As shown in FIG. 5B, when the area density of positive charge in the insulating film is 0 [a.u.], the maximum values of electric field strengths in the insulating film of the samples 1 to 3 are each different. The maximum value of electric field strength of the sample 1 is the lowest, the maximum value of the sample 2 is slightly higher than that of the sample 1, and the maximum value of the sample 3 is higher than those of the samples 1 and 2.

Within a range of area density of positive charge in the insulating film of 0 to 6 [a.u.], the maximum values of electric field strengths of the samples 1 and 2 are increased at about the same rate. At an area density of positive charge of 2 [a.u.], the maximum value of electric field strength of the sample 3 is decreased and is the same as that of the sample 2. At 4 [a.u.], the maximum value of the sample 3 is slightly increased and is now the same as that of the sample 1. At 6 [a.u.], the maximum value of the sample 3 is slightly increased and is now lower than those of the samples 1 and 2. Consequently, the maximum value of electric field strength in the insulating film of the sample 3 is the lowest at area densities of positive charge of 4 [a.u.] and 6 [a.u.]. The displacement width of maximum value of electric field strength in the insulating film of the sample 3 within a range of area densities of positive charge of 2 to 6 [a.u.] is the smallest. Therefore, even when the area density of positive charge in the insulating film of the sample 3 is increased due to hot carrier injection, the electric field in the insulating film can be decreased.

Accordingly, the semiconductor device according to the embodiment has good breakdown voltage.

(First Modification of First Embodiment)

In a semiconductor device 102 according to a modification, for example, seven guard ring layers 13 of the first embodiment are provided, and six conductive members 50 are provided. However, the intervals between the guard ring layers 13 in the first direction E1 become narrower towards the cell side CS and wider towards the end side ES. Also, the conductive members 50 arranged on the cell side CS have a positional relationship with the guard ring layers 13 that is different from that described for the semiconductor device 101.

Figure 6A:
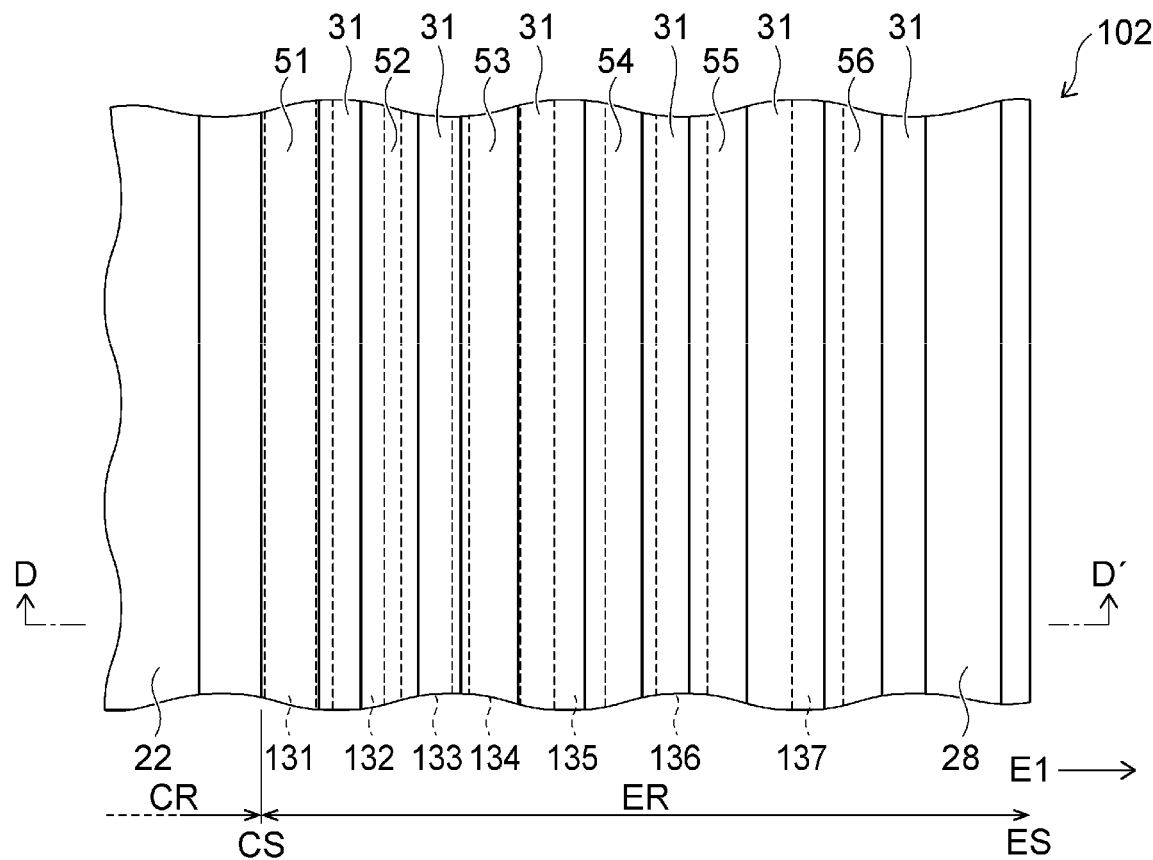
FIG. 6A is an enlarged plan view of a semiconductor device according to a first modification of a first embodiment.
Figure 6B:
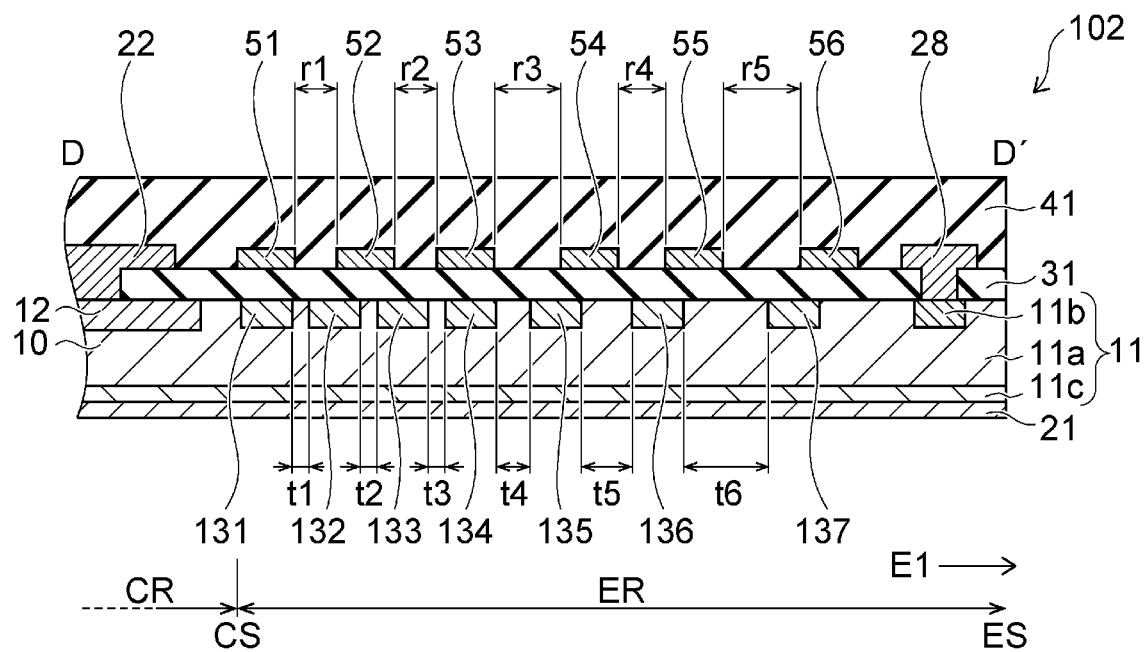
FIG. 6B is a cross-sectional view taken along a line D-D' illustrated in FIG. 6A.

FIG. 6A is an enlarged plan view of the semiconductor device according to this modification, and FIG. 6B is a cross-sectional view taken along a line D-D' illustrated in FIG. 6A. In FIGS. 6A and 6B, a wiring layer and the protective film 41 are omitted from the depiction.

Hereinafter, the positional relationship between the conductive members 50 and the guard ring layers 13 will be described.

As illustrated in FIG. 6B, guard ring layers 131, 132, 133, 134, 135, 136, and 137 are arranged in this order in the first direction E1. Intervals t1 to t6 are respective intervals between the guard ring layers 131 to 137. The intervals t1 to t3 are substantially the same. The intervals t4 to t6 increase, such that interval t5 is greater than interval t4, and interval t6 is greater than interval t5. Each of the intervals t1 to t3 are narrower than the interval t4.

As illustrated in FIGS. 6A and 6B, conductive members 51, 52, 53, 54, 55, and 56 are arranged in this order in the first direction E1. The conductive members 51 to 56 are arranged at respective intervals r1, r2, r3, r4, and r5 in the first direction E1. The intervals r1 and r2 are substantially the same. For example, the intervals r1 and r2 are slightly shorter than the lengths of the conductive members 51 to 53 in the first direction E1 but are wider than the intervals t1 to t3. The interval r3 is wider than the intervals r1 and r2. The interval r4 is narrower than the interval r3, and the interval r5 is wider than the intervals r3 and r4.

The conductive member 51, which is positioned the nearest to the cell side CS, is provided directly above the guard ring layer 131, which is positioned the nearest to the cell side CS, and is not shifted in the first direction E1.

The conductive member 52 is disposed on the end side ES of the conductive member 51. The conductive member 52 is disposed with respect to the guard ring layer 132 in the same positional relationship corresponding that in the first embodiment described for every guard ring layer 13 and conductive member 50 between the conductive member 52 and the guard ring layer 132. That is, as viewed from above, a portion on the end side ES of the guard ring layer 132 is covered with a portion on the cell side CS of the conductive member 52. However, a portion on the cell side CS of the guard ring layer 133 is also covered with a portion on the end side ES of the conductive member 52, but a portion on the end side ES of the guard ring layer 133 is not covered with a conductive member.

The conductive member 53 is disposed on the end side ES of the conductive member 52. As viewed from above, a region directly above the guard ring layer 134 is almost entirely covered by the conductive member 53, which does not satisfy the positional relationship described for the first embodiment.

The guard ring layer 135 on the end side ES and the conductive member 54, the guard ring layer 136 and the conductive member 55, and the guard ring layer 137 and the conductive member 56 are each disposed in the same positional relationship as that described for the first embodiment for the guard ring layers 13 and the conductive members 50.

Hereinafter, an effect of the semiconductor device 102 according to the modification will be described.

The guard ring layers 131 to 137 are disposed on the cell side CS at reduced intervals t1 to t3, and thus the breakdown voltage of a portion on the cell side CS in the end region ER is increased. The conductive members 51 to 53 are substantially uniformly provided on the guard ring layers 131 to 134 on the cell side CS at intervals r1 and r2. Therefore, intermittent conductive regions are formed on the guard ring layers 131 to 134, the breakdown voltage is increased, and an influence of external charge is reduced.

The conductive member 52 positioned at a center of the conductive members 51 to 53, and the guard ring layer 132 are disposed in the positional relationship of the first embodiment, and thus the reliability of the semiconductor portion 10 and the insulating film 31 is enhanced. A portion on the end side ES of the conductive member 52 is disposed on a portion on the cell side CS of the guard ring layer 133, and the breakdown voltage around the guard ring layer 133 is enhanced. The conductive members 54 to 56 and the guard ring layers 135 and 136 that are arranged on the end side ES at wider intervals are disposed in same the positional relationship as the first embodiment. Therefore, in the semiconductor device 102 of the modification, the breakdown voltage can be increased, and dielectric breakdown of the insulating film 31 and the semiconductor portion 10 can be prevented.

Configurations, operations, and effects other than those described above in the modification are the same as those in the first embodiment.

(Second Modification of First Embodiment)

In a semiconductor device 103 according to a modification, seven guard ring layers 131 to 137 are provided, like the first modification. Furthermore, among respective intervals t1 to t6 between the guard ring layers 131 to 137, the intervals t1 to t3 are narrower than the intervals t4 to t6. Unlike the first modification, the conductive members 51 to 55 are disposed in a zigzag pattern of intermittent subportions as viewed from above.

Figure 7:
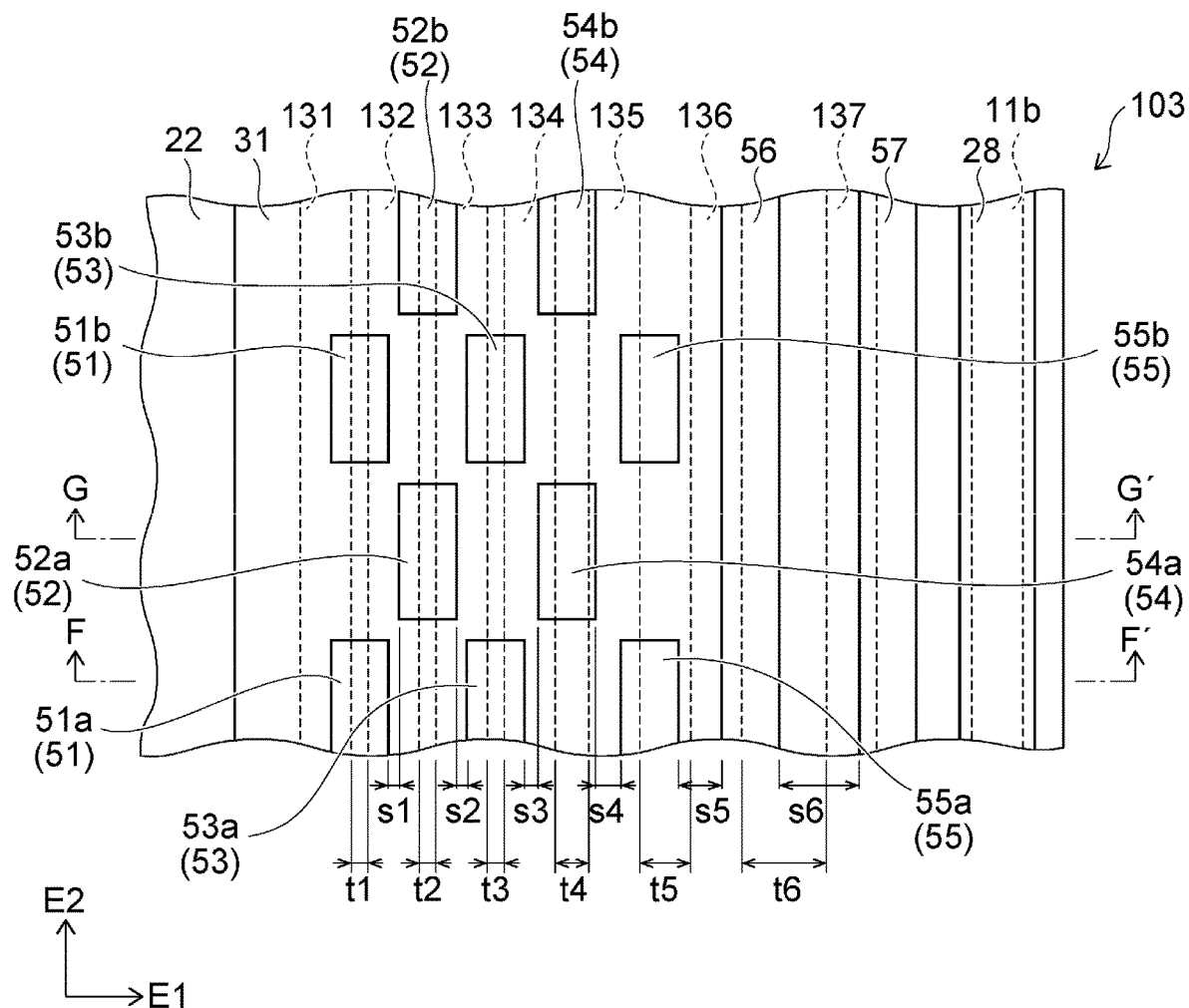
FIG. 7 is an enlarged plan view of a semiconductor device according to a second modification of the first embodiment.
Figure 8A:
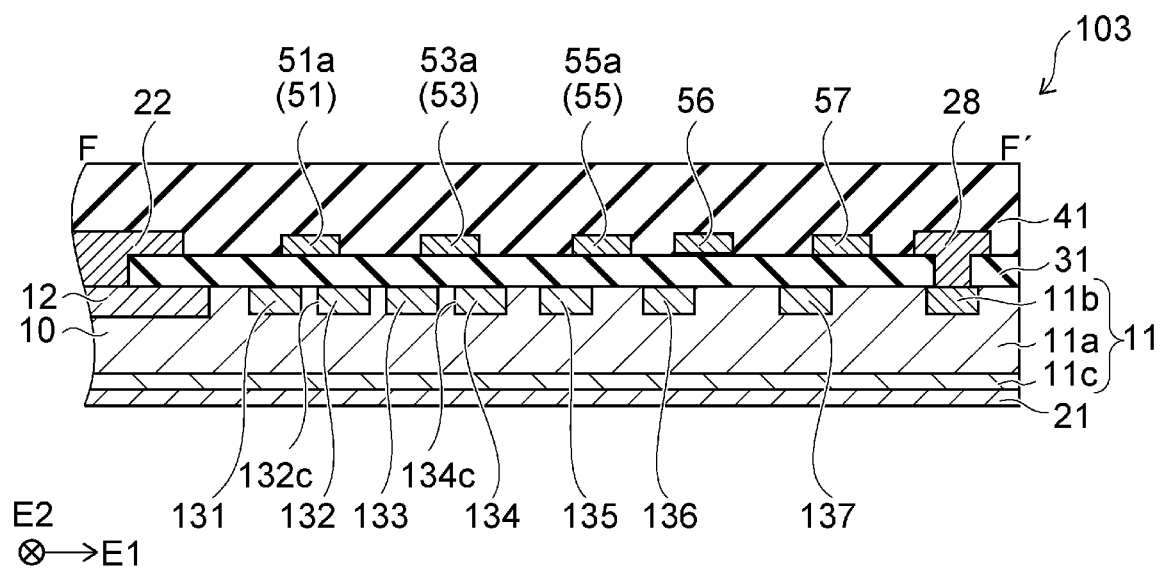
FIG. 8A is a cross-sectional view taken along a line F-F' illustrated in FIG. 7.
Figure 8B:
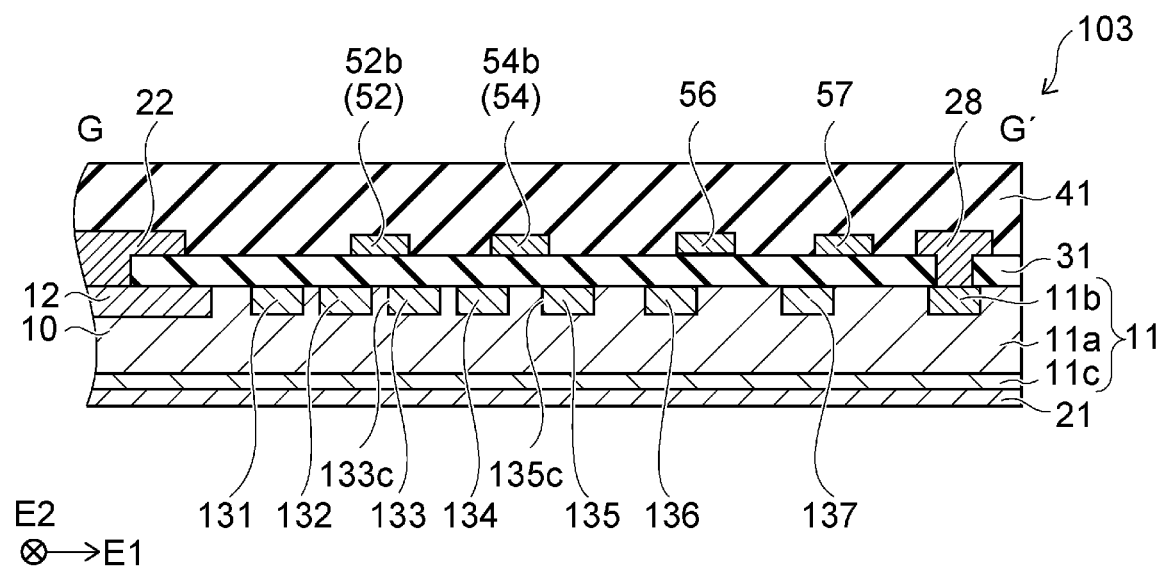
FIG. 8B is a cross-sectional view taken along a line G-G' illustrated in FIG. 7.

FIG. 7 is an enlarged plan view of the semiconductor device 103 according to this modification. FIG. 8A is a cross-sectional view taken along a line F-F' illustrated in FIG. 7. FIG. 8B is a cross-sectional view taken along a line G-G' illustrated in FIG. 7. In FIG. 7, a wiring layer and the protective film 41 are omitted. As illustrated in FIG. 7, a second direction E2 is a direction orthogonal to the first direction E1 in a plane. For example, the second direction E2 is a direction parallel to an outer circumference of the cell region CR.

As illustrated in FIG. 7, the interval t1 between the guard ring layers 131 and 132, the interval t2 between the guard ring layers 132 and 133, and the interval t3 between the guard ring layers 133 and 134 are substantially the same, and are narrower than the intervals t4 to t6. The interval t4 between the guard ring layers 134 and 135 is smaller than the interval t5 between the guard ring layers 135 and 136, and the interval t6 between the guard ring layers 136 and 137 is larger than the interval t5.

Hereinafter, a positional relationship of zigzag pattern of the conductive members 51 to 55 in the modification will be described using the conductive members 53 to 55 and the guard ring layers 133 to 135 as examples.

As illustrated in FIGS. 7 and 8A, the conductive member 53 provided the nearest to the cell region CR of each of the conductive members 53 to 55 is disposed on the guard ring layer 133, which is provided the nearest to the cell region CR of the guard ring layers 133 to 136 in the same positional relationship as the first embodiment. The conductive member 53 is disposed directly above a cell-side edge 134c of the guard ring layer 134. The conductive member 53 includes at least a first portion 53a and a second portion 53b that are separated. The second position 53b is disposed on a side of the second direction E2 of the first portion 53a.

As illustrated in FIGS. 7 and 8B, the conductive member 54 is disposed on the guard ring layer 134 in the same positional relationship as described for the first embodiment with respect to conductive members 50 and guard ring layers 13. The conductive member 54 is disposed directly above a cell-side edge 135c of the guard ring layer 135. The conductive member 54 includes at least a first portion 54a and a second portion 54b that are separated. The second position 54b is disposed on the side of the second direction E2 of the first portion 54a.

As illustrated in FIGS. 7 and 8A, the conductive member 55 is disposed on the guard ring layer 135 in the same positional relationship as described for the first embodiment with respect to conductive members 50 and guard ring layers 13. The conductive member 55 is not disposed on the guard ring layer 136. The conductive member 55 includes at least a first portion 55a and a second portion 55b that are separated. The second position 55b is disposed on the side of the second direction E2 of the first portion 55a.

As illustrated in FIG. 7, the conductive member 55 is disposed in the first direction E1 from the conductive member 53. Specifically, the first portion 55a is disposed in the first direction E1 of the first portion 53a, and the second portion 55b is disposed in the first direction E1 of the second portion 53b.

The conductive member 54 is shifted in the second direction E2 with respect to the interval between the conductive members 53 and 55. Specifically, the first portion 54a is shifted in the second direction E2 with respect to the interval between the first portion 53a and the first portion 55a. The second portion 54b is shifted in the second direction E2 with respect to the interval between the second portion 53b and the second portion 55b.

An interval s3 between the conductive members 53 and 54 and an interval s4 between the conductive members 54 and 55 are in a diagonal position of each other. As illustrated in FIG. 7, adjacent positions between the conductive members 53 and 55 are in a diagonal position between the intervals s3 and s4. Therefore, even when the intervals s3 and s4 are not large, an influence on the electric field strength and the like is small. When the first portion 54a of the conductive member 54 is appropriately shifted in the second direction E2, the distances between the conductive members 53 to 55 in the intervals s3 and s4 can be adjusted. The first portion 54a of the conductive member 54 is adjacent to the interval between the first portion 53a of the conductive member 53 and the first portion 55a of the conductive member 55, and this improves reliability.

The other conductive members 51 and 52 arranged on the cell side CS and the guard ring layers 131, 132, and 133 are also provided similarly to the conductive members 53, 54, and 55 and the guard ring layers 133 to 135.

Hereinafter, an effect of the semiconductor device 103 according to the modification will be described.

The conductive members 51 to 55 are separated into sub-portions which provided in a zigzag pattern above the guard ring layers 131 to 135 on the cell side CS where the intervals are narrower than those on the end side ES. Therefore, the positional relationship of the first embodiment can be adopted in all the conductive members 51 to 55 on the cell side CS, and the reliability of the semiconductor device 103 can be enhanced. When intermittent conductive regions formed by the conductive members 51 to 55 on the guard ring layers 131 to 135 are provided, the breakdown voltage is enhanced, and an influence of external charge is reduced. In the conductive members 56 and 57 provided on the end side ES, the positional relationship of the first embodiment for the guard ring layers 136 and 137 is adopted. Therefore, in the semiconductor device 103 of the modification, for example, the breakdown voltage can be increased, and dielectric breakdown of the insulating film 31 and the semiconductor portion 10 can be prevented.

In this modification, the shapes of the first portions 51a, 52a, and 53a that are separated sub-portions of the conductive members 51, 52, and 53 are the same as those of the second portions 51b, 52b, and 53b, but are not limited thereto. For example, the number of separations, the length of the second direction E2, and the like can be appropriately adjusted. Additionally, the lengths of the intervals s1, s2, and s3 may be different from one another.

Configurations, operations, and effects other than those described above in the modification are the same as those in the first embodiment.

Second Embodiment

In a semiconductor device 104 according to a second embodiment, a conductive plate 60 is provided on each of the guard ring layers 13.

Figure 9:
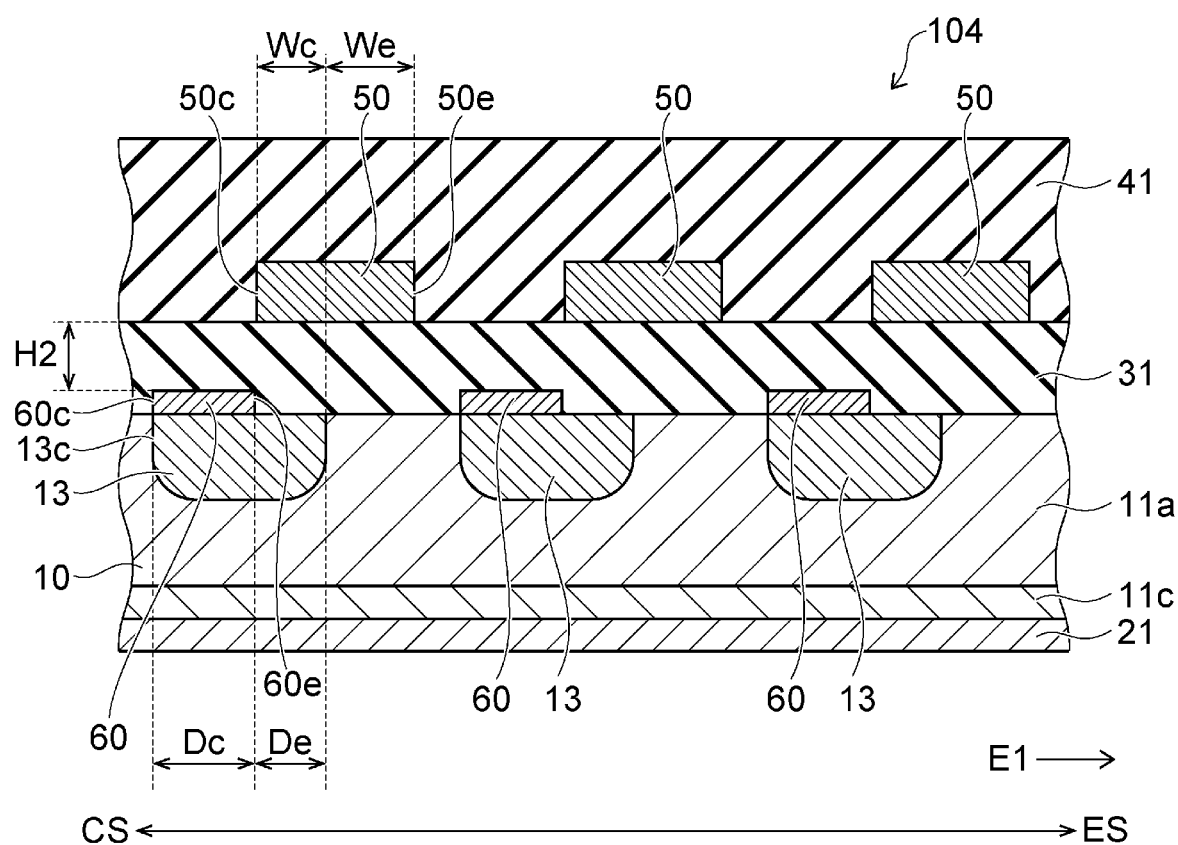
FIG. 9 is an enlarged cross-sectional view of a semiconductor device according to a second embodiment.

FIG. 9 is an enlarged cross-sectional view of the semiconductor device 104 according to the second embodiment. FIG. 9 represents the same portion of a semiconductor device as that depicted in FIG. 4 for semiconductor device 101. FIG. 9 is a cross section parallel to the first direction E1.

For example, the conductive plate 60 comprises titanium or polysilicon. As illustrated in FIG. 9, a conductive plate 60 is provided on each of the guard ring layers 13 in the end region ER. A lower surface of each conductive plate 60 is in contact with the corresponding guard ring layer 13. The potential of the conductive plates 60 is thus substantially the same as that of the guard ring layers 13, for example, a source potential (0 V). The surfaces other than the lower surface of the conductive plates 60 are covered with the insulating film 31. Each of the conductive plates 60 is separated from the conductive members 50 by the insulating film 31. An interval H2 is between the upper surfaces of the conductive plates 60 and the lower surfaces of the conductive members 50.

The conductive plates 60 are each provided on the cell-side portion Dc of a guard ring layer 13. The length of the conductive plate materials 60 in the first direction E1 is substantially the same as the length of the cell-side portion Dc of the guard ring layers 13 in the first direction E1. It is desirable that the cell-side edge 60c of each of the conductive plates 60 be disposed directly above the cell-side edge 13c of the corresponding guard ring layers 13. However, exact alignment is not required, and the cell-side edge 60c of each conductive plate 60 may be disposed slightly nearer to the cell side CS or more towards the end side ES than the cell-side edge 13c.

It is preferable that an end-side edge 60e of each of the conductive plates 60 be disposed directly below the cell-side edge 50c of the conductive members 50. However, the end-side edge 60e of each of the conductive plates 60 may be disposed slightly nearer to the cell side CS than the corresponding cell-side edge 50c. In this case, the isoelectric line is easily shifted from the first region Ie to the second region Ic. The end-side edge 60e of each of the conductive plates 60 may be disposed slightly nearer to the end-side edge ES than the cell-side edge 50c of the corresponding conductive members 50.

Hereinafter, an effect of the semiconductor device 104 according to the embodiment will be described.

In the semiconductor device 104 according to the embodiment, each of the conductive plates 60 is provided on the cell-side portion Dc of the guard ring layers 13. The cell-side portion Dc is not covered by the corresponding conductive member 50. Therefore, an influence of external charge on the cell-side portion Dc of each of the guard ring layers 13 can be reduced. When the conductive plates 60 are thus disposed, the isoelectric line is easily shifted through the interval H2 to the cell side CS of each of the conductive members 50, like the first embodiment. Therefore, the concentration of electric field on the end side ES of the conductive members 50 can be prevented.

In this second embodiment, the conductive plates 60 are in direct contact with the guard ring layers 13, but are not limited to this disposition.

In the second embodiment, a plurality of guard ring layers 13 are provided at substantially the same intervals, but are not limited to this configuration. For example, guard ring layers 13 and conductive members 50 can be disposed like the corresponding structures in the first or second modifications of the first embodiment. Similarly, conductive plates 60 may be disposed on just some of the guard ring layers 13, like the conductive members 50.

According to the embodiments, a semiconductor device capable of improving reliability can be provided.

Hereinabove, the embodiments are described with reference to specific examples. However, the embodiments are not limited to the specific examples. For example, specific configurations, shapes, materials, and the like of the semiconductor portion, the guard ring layer, the conductive member, and the conductive plate material contained in the semiconductor device can be appropriately selected from scopes known by those skilled in the art, and the embodiments are performed. These are contained in the scope of the embodiments as long as the same effects as those of the embodiments can be obtained. Furthermore, any two or more elements of the specific examples may be combined within the extent of technical feasibility and are included in the scope of the embodiments as long as the outline of the embodiments is included.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a cell region;
   an end region adjacent to the cell region in a first direction and surrounding the cell region;
   a first semiconductor layer of a first conductivity type in the cell region and the end region;
   a plurality of guard rings of a second conductivity type at a first surface of the first semiconductor layer in the end region, the guard rings surrounding the cell region and being concentrically spaced from each other in the first direction;
   an insulating film on the first surface of the first semiconductor layer in the end region; and
   a plurality of conductive members on the insulating film and separated from the plurality of guard rings by the insulating film in a second direction orthogonal to the first surface, wherein
   a first conductive member in the plurality of conductive members has a cell-region-side edge above, in the second direction, a central portion of a first guard ring in the plurality of guard rings, the first guard ring having an end-region-side edge below, in the second direction, a central portion of the first conductive member.

2. The semiconductor device according to claim 1, wherein no conductive member in the plurality of conductive members other than the first conductive member overlaps with the first guard ring in the second direction.

3. The semiconductor device according to claim 2, wherein no guard ring in the plurality of guard rings other than the first guard ring overlaps with the first conductive member in the second direction.

4. The semiconductor device according to claim 3, further comprising:
   a first conductive plate above the first guard ring in the second direction, the first conductive plate being in the insulating film and not overlapping with the first conductive member in the second direction.

5. The semiconductor device according to claim 4, wherein the first conductive plate is in direct contact with the first guard ring.

6. The semiconductor device according to claim 1, wherein the distance in the first direction between every adjacent pair of guard rings in the plurality of guard rings is the same.

7. The semiconductor device according to claim 6, wherein the distance in the first direction between every adjacent pair of conductive members in the plurality of conductive members is the same.

8. The semiconductor device according to claim 1, wherein the distance in the first direction between every adjacent pair of conductive members in the plurality of conductive members is the same.

9. The semiconductor device according to claim 1, wherein the total number of guard rings in the plurality of guard rings is equal to the total number of conductive members in the plurality of conductive members.

10. The semiconductor device according to claim 1, wherein at least one conductive member in the plurality of conductive members comprises a plurality of sub-portions separated from each other in a third direction by an insulating material, the third direction intersecting the first direction.

11. The semiconductor device according to claim 1, wherein each conductive member in the plurality of conductive members comprises a plurality of sub-portions separated from each other in a third direction by an insulating material, the third direction intersecting the first direction.

12. The semiconductor device according to claim 11, wherein the sub-portions of adjacent conductive members are offset from each other in the third direction to form a zigzag pattern.

13. The semiconductor device according to claim 1, wherein a spacing interval between adjacent pairs of guard rings in the plurality of guard rings changes with distance away from the cell region.

14. The semiconductor device according to claim 1, wherein the distance between a first pair of adjacent conductive members in the plurality of conductive members is not equal to the distance between a second pair of adjacent conductive members in the plurality of conductive members.

15. The semiconductor device according to claim 1, wherein
   every conductive member in the plurality of conductive members has a cell-region-side edge above, in the second direction, a central portion of one guard ring in the plurality of guard rings, and
   every guard ring in the plurality of guard rings has an end-region-side edge below, in the second direction, a central portion of one conductive member in the plurality of conductive members.

16. The semiconductor device according to claim 1, further comprising:
a first electrode in the cell region and the end region below the first semiconductor layer in the second direction;
a second electrode in the cell region above the first semiconductor layer in the second direction;
a third electrode in the end region above the first semiconductor layer in the second direction, wherein
the third electrode is spaced from the second electrode in the first direction, and
the plurality of conductive members are on the first surface between the second and third electrodes in the first direction.

17. A semiconductor device, comprising:
a cell region;
an end region adjacent to the cell region in a first direction and surrounding the cell region;
a first semiconductor layer of a first conductivity type in the cell region and the end region;
a first guard ring of a second conductivity type at a first surface of the first semiconductor layer in the end region, the first guard ring surrounding the cell region;
an insulating film on the first surface of the first semiconductor layer in the end region; and
a first conductive member on the insulating film and separated from the first guard ring by the insulating film in a second direction orthogonal to the first surface, wherein
the first conductive member has a cell-region-side edge above, in the second direction, a central portion of the first guard ring, and
the first guard ring has an end-region-side edge below, in the second direction, a central portion of the first conductive member.

18. The semiconductor device according to claim 17, further comprising:
a first conductive plate above the first guard ring in the second direction, the first conductive plate being in the insulating film and not overlapping with the first conductive member in the second direction.

19. The semiconductor device according to claim 17, wherein the first conductive member comprises a plurality of sub-portions separated from each other in a third direction by an insulating material, the third direction intersecting the first direction.

20. The semiconductor device according to claim 17, further comprising:
a first electrode in the cell region and the end region below the first semiconductor layer in the second direction;
a second electrode in the cell region above the first semiconductor layer in the second direction;
a third electrode in the end region above the first semiconductor layer in the second direction, wherein
the third electrode is spaced from the second electrode in the first direction, and
the first conductive member is on the first surface between the second and third electrodes in the first direction.

* * * * *